United States Patent
Simin et al.

(10) Patent No.: US 8,552,562 B2
(45) Date of Patent: Oct. 8, 2013

(54) PROFILED CONTACT FOR SEMICONDUCTOR DEVICE

(75) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

(*) Notice: Subject to any disclaimer, the term of this patent is extended or adjusted under 35 U.S.C. 154(b) by 372 days.

(21) Appl. No.: 12/791,288

(22) Filed: Jun. 1, 2010

(65) Prior Publication Data

US 2010/0301490 A1    Dec. 2, 2010

Related U.S. Application Data

(60) Provisional application No. 61/217,531, filed on Jun. 1, 2009.

(51) Int. Cl.
- *H01L 27/148* (2006.01)
- *H01L 23/48* (2006.01)
- *H01L 23/52* (2006.01)
- *H01L 29/40* (2006.01)
- *H01L 21/44* (2006.01)

(52) U.S. Cl.
USPC 257/773; 257/215; 257/E21.59; 257/E23.168; 438/666

(58) Field of Classification Search
USPC .................................. 257/245, 249
See application file for complete search history.

(56) References Cited

U.S. PATENT DOCUMENTS 5,173,757 A * 12/1992 Miwada ................. 257/215

OTHER PUBLICATIONS

Saddow et al., "Advances in Silicon Carbide Processing and Applications", Semiconductor Materials and Devices Series, Copyright 2004, Artech House, Inc., 218 pages.
Seymour B. Cohn, "Rounded Corners in Microwave High-Power Filters and Other Components", IRE Transactions on Microwave Theory and Techniques, Sep. 1961, pp. 389-397.
Feiler et al., "Multistep Field Plates for High-Voltage Planar p-n Junctions", IEEE Transactions on Electron Devices, vol. 39, No. 6, Jun. 1992, pp. 1514-1520.
Basavana et al., "Analysis and Optimal Design of Semi-Insulator Passivated High-Voltage Field Plate Structures and Comparison with Dielectric Passivated Structures", IEEE Transactions on Electron Devices, vol. 41, No. 10, Oct. 1994, pp. 1856-1865.
Turin et al., "Simulations of Field-Plated and Recessed Gate Gallium Nitride-Based Heterojunction Field-Effect Transistors", International Journal of High Speed Electronics and Systems, vol. 17, No. 1, 2007, pp. 19-23.

* cited by examiner

*Primary Examiner* — Fernando L Toledo
*Assistant Examiner* — Valerie N Newton
(74) *Attorney, Agent, or Firm* — LaBatt, LLC

(57) ABSTRACT

A profiled contact for a device, such as a high power semiconductor device is provided. The contact is profiled in both a direction substantially parallel to a surface of a semiconductor structure of the device and a direction substantially perpendicular to the surface of the semiconductor structure. The profiling can limit the peak electric field between two electrodes to approximately the same as the average electrical field between the electrodes, as well as limit the electric field perpendicular to the semiconductor structure both within and outside the semiconductor structure.

20 Claims, 8 Drawing Sheets

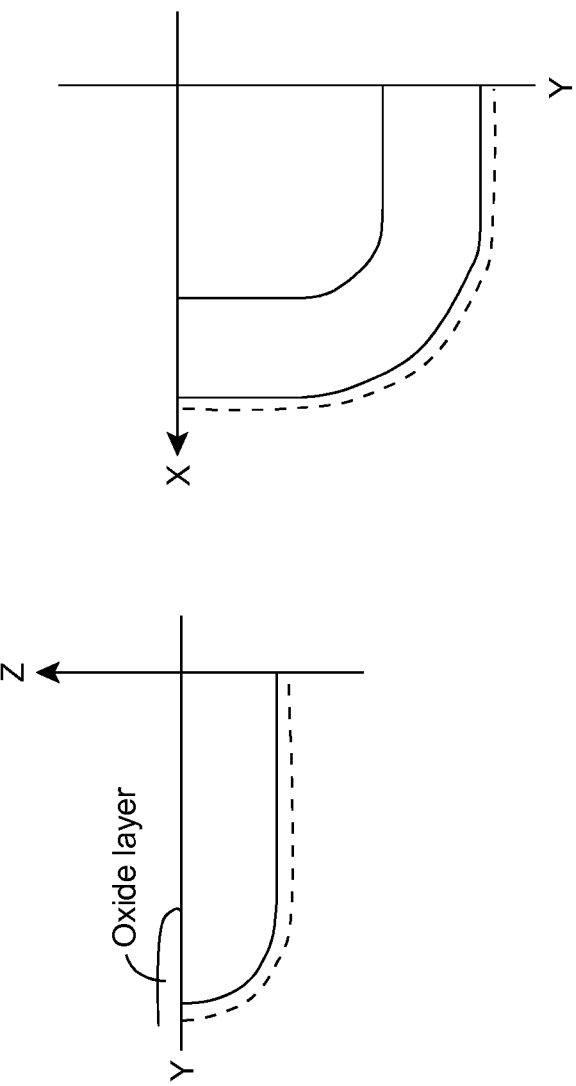

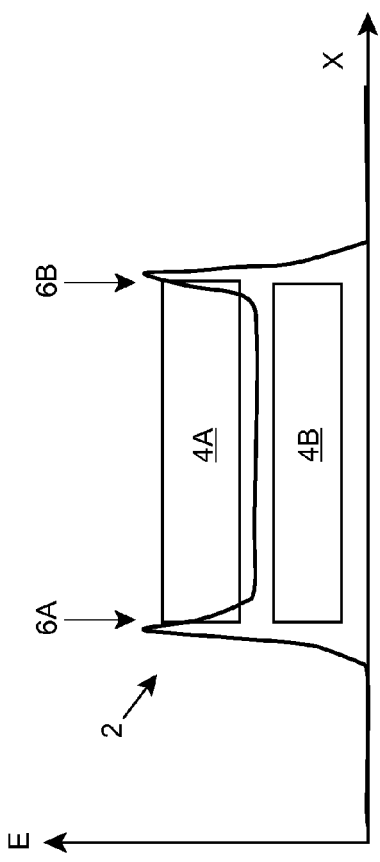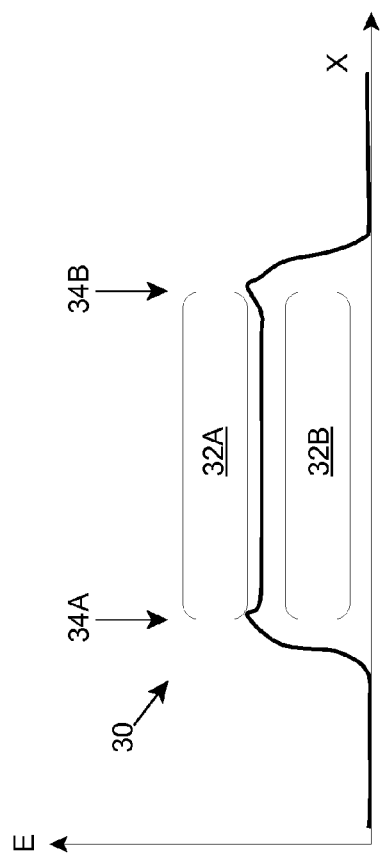

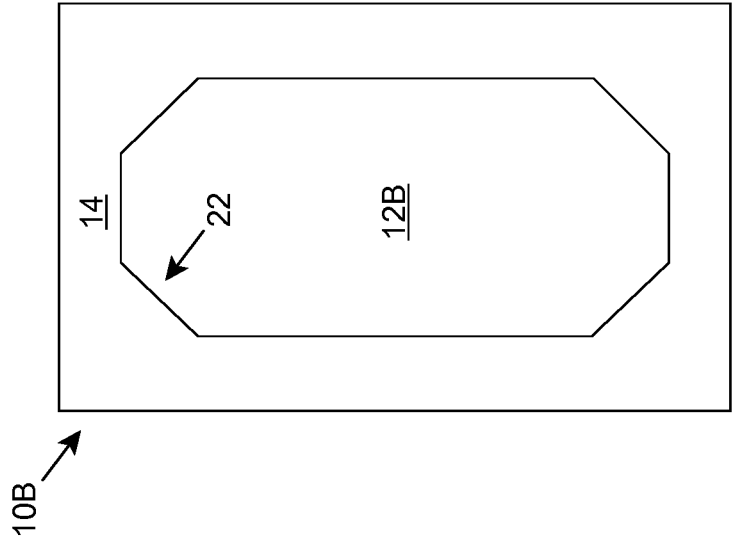
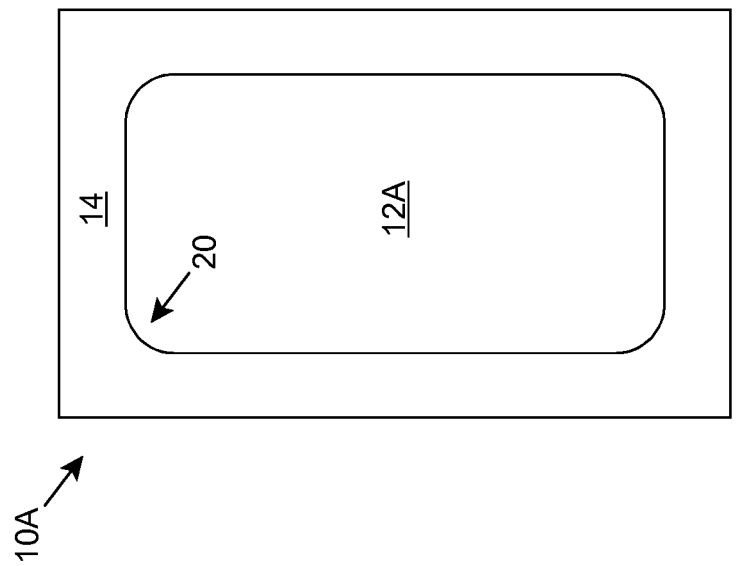

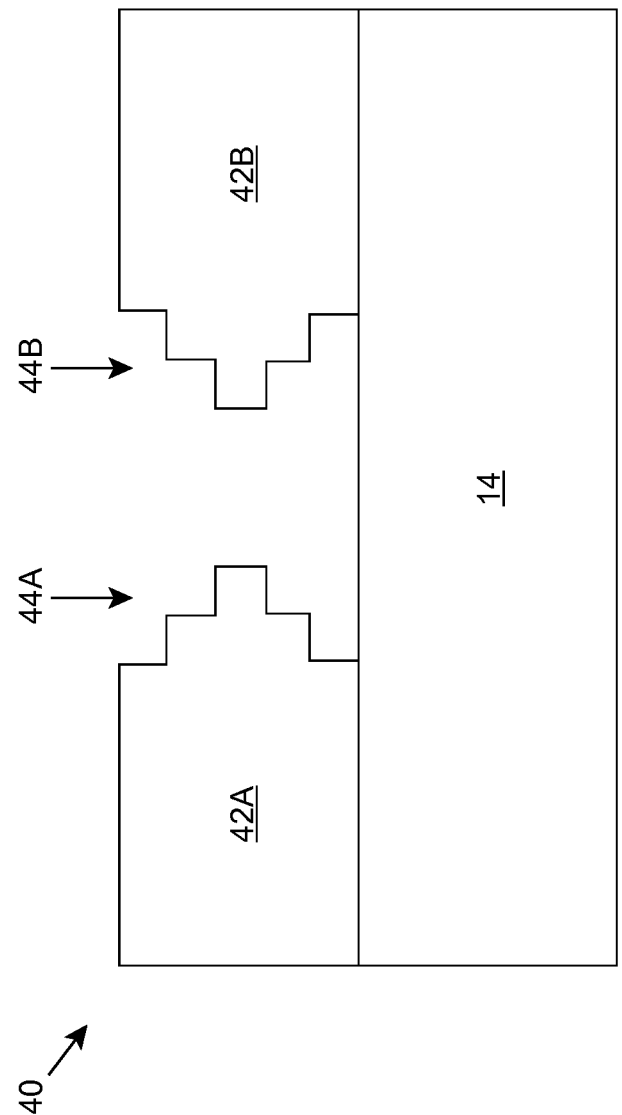

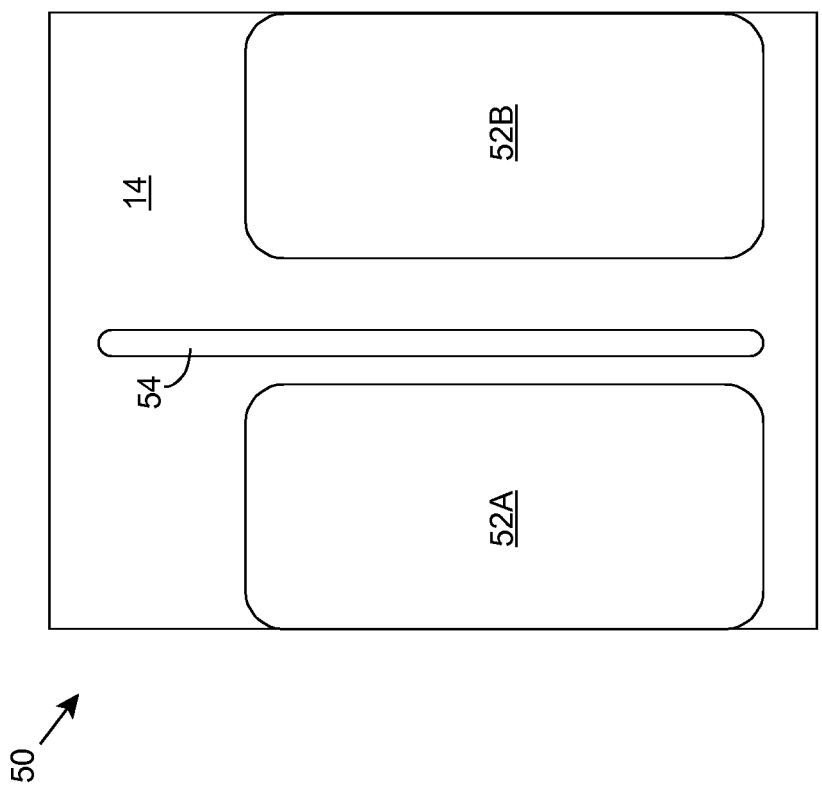

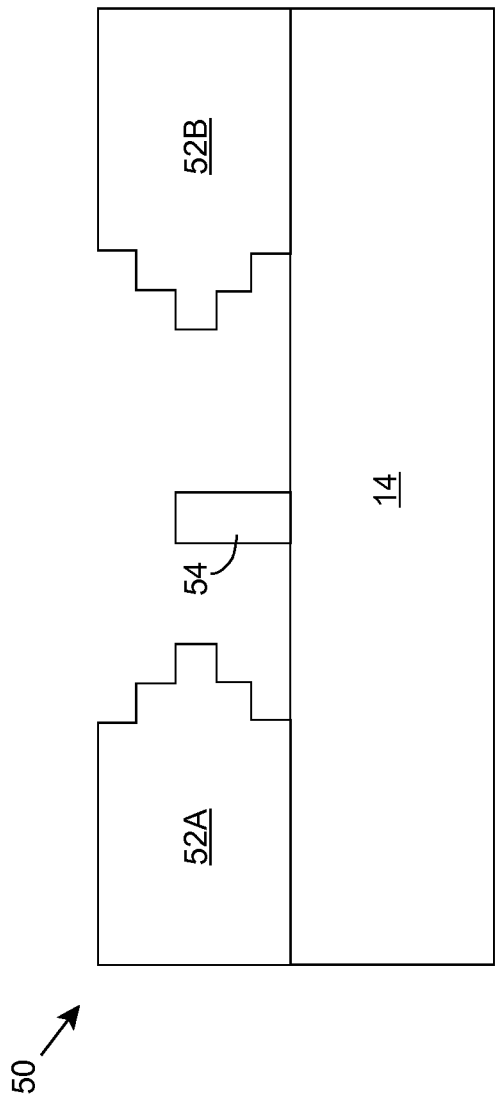

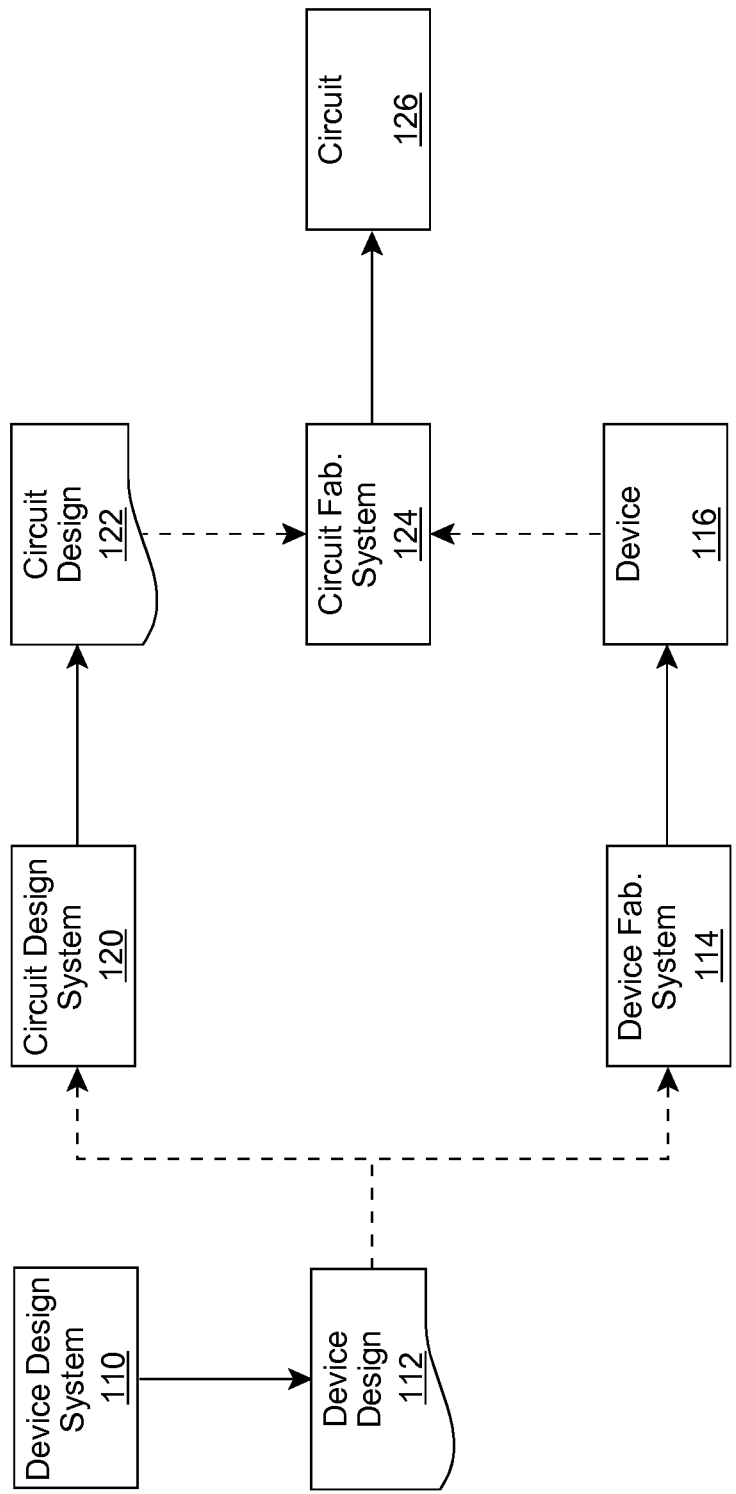

PROFILED CONTACT FOR SEMICONDUCTOR DEVICE

REFERENCE TO PRIOR APPLICATIONS

The current application claims the benefit of co-pending U.S. Provisional Application No. 61/217,531, titled "High voltage semiconductor device", which was filed on 1 Jun. 2009, and which is hereby incorporated by reference.

TECHNICAL FIELD

The disclosure relates generally to contacts for devices, and more particularly, to a profiled contact for a semiconductor device, such as a high voltage semiconductor device.

BACKGROUND ART

High voltage operation of devices, such as semiconductor devices, has remained a focus of intense research for decades. An ability of a semiconductor device to operate at a high level of bias and signal voltage is an important characteristic defining an overall device figure of merit. When an operating voltage approaches or exceeds the breakdown voltage for a particular semiconductor material and/or device structure and layout, the device becomes inoperable due to non-recoverable damage to the semiconductor material and/or electrodes forming the device. Numerous approaches have been proposed seeking to increase the breakdown voltage, and as a result, the operating voltages of a device.

Normally, the maximum operating voltage of a device is limited by the development of strong spikes of an electric field at the electrode edges or at the edges of p-n junctions. These spikes can lead to a local breakdown in such regions making the device inoperable. The spikes can form at voltages well below those expected from the average electric field in the bulk of the device material, causing the device breakdown to occur at an operating voltage well below the breakdown field of the bulk of the device material.

Many high power semiconductor devices are fabricated from silicon material, which has a relatively low breakdown field of thirty kilovolts per centimeter (kV/cm), close to that of air. In most of these devices, the breakdown occurs in the device itself, not in the air surrounding the device. As a result, most approaches seeking to maximize the operating voltage have been centered on optimization of the electric field profiles inside the device. Several approaches, including field terminating plates, guard rings, special doping profiles, etc., have sought to smoothen the electric field distribution within the device. For example, FIG. 1 shows an illustrative configuration for an electrode with multiple field plates according to the prior art. The multiple field plates can reduce the peak electric field in the semiconductor material, thereby increasing the operating voltage of the device. Similarly, FIG. 2 shows an illustrative rounded junction electrode structure according to the prior art. The rounded p-n junction formed in the semiconductor material can reduce the peak electric field in the semiconductor material, thereby increasing the operating voltage of the device.

Wide bandgap semiconductor materials, such as silicon carbide (SiC) and gallium nitride (GaN) are also being used to fabricate high power semiconductor devices. These materials comprise breakdown fields that are much higher than that of air. As a result, the SiC and/or GaN device design for high voltage operation can include measures to eliminate the breakdown in the surrounding air or semiconductor surface regions. A majority of SiC based high power devices have vertical structure, meaning that high voltage electrodes are located on opposing sides of the semiconductor wafer. Examples include high voltage diodes, bipolar junction transistors, and field effect transistors. In vertical geometry devices, the breakdown normally occurs in the surface regions of the semiconductor material where the electric field concentrates near the edges of a p-n junction or diffused regions. Consideration of direct breakdown between the electrodes in the air is less important due to a large separation between the high voltage electrodes.

High power devices fabricated using GaN and AlGaN compounds typically have a planar lateral layout. An important example of such devices is the heterostructure field effect transistor (HFET). For high gain, high speed operation, it is often desirable to reduce the spacing between the source, gate, and drain electrodes. The reduced spacing increases the electric field between the electrodes and theoretically makes the occurrence of a breakdown in the air surrounding the electrodes more likely since the internal breakdown field for GaN and AlGaN compounds, which is approximately five megavolts per centimeter (MV/cm), is much higher than that of air. However, one or more of the electrodes for GaN-based devices typically requires a high temperature (above 850 degrees Celsius) annealing, e.g., to form an ohmic contact. Due to the high annealing temperature typical for GaN-based devices, the contact edges get fairly rough. As a result, a highly non-uniform electric field is present at the rough edges of the ohmic contacts causing the breakdown to normally occur between the contact non-uniformities, regardless of the electrode shape.

Recently, non-annealed overlapping contacts, such as field controlling electrodes and RF enhanced contacts have been proposed for use in high voltage planar devices. In devices with overlapping contacts, a minimal inter-electrode spacing corresponds to the manufacture of the electrodes without the use of high temperature annealing. As a result, the edges of the electrodes have very low roughness compared to the high temperature annealed electrodes. In devices with field-controlling plates, the additional electrode minimizes the electric field spike in the semiconductor layer close to the gate edge.

SUMMARY OF THE INVENTION

The inventors recognize that breakdown in the air or encapsulating material may occur before the breakdown field in the semiconductor has been reached when the device is fabricated using a semiconductor material with a high breakdown field, such as GaN. Currently, such breakdowns have not been frequent due to, for example, rough edges of the contacts typically used. As a result, little or no approaches have sought to use electrode shaping to achieve a higher breakdown voltage and/or eliminate direct inter-electrode breakdown. The inventors propose that reducing or eliminating the possibility for breakdown in the surrounding air or encapsulating material between electrodes can comprise an important solution to achieve a higher operating voltage of a device, e.g., an operating voltage close to the breakdown voltage of the bulk of the semiconductor material used to fabricate the device.

Aspects of the invention provide a profiled contact for a device, such as a high power semiconductor device. The contact is profiled in both a direction substantially parallel to a surface of a semiconductor structure of the device and a direction substantially perpendicular to the surface of the semiconductor structure. The profiling can limit the peak electric field between two electrodes to approximately the same as the average electrical field between the electrodes, as well as limit the electric field perpendicular to the semiconductor structure both within and outside the semiconductor structure.

A first aspect of the invention provides a device comprising: a semiconductor structure; and a first contact located on the semiconductor structure, wherein the first contact comprises at least two contact corners having a parallel profiled shape in a direction substantially parallel with respect to a surface of the semiconductor structure and at least one edge between the at least two contact corners comprising a perpendicular profiled shape in a direction substantially perpendicular to the surface of the semiconductor structure.

A second aspect of the invention provides a method comprising: designing a semiconductor device, the designing including configuring a shape of a first contact to a semiconductor structure of the device, wherein the configuring includes: defining a parallel profiled shape for at least two contact corners of the first contact in a direction substantially parallel with respect to a surface of the semiconductor structure; and defining a perpendicular profiled shape for at least one edge of the first contact between the at least two contact corners in a direction substantially perpendicular to the surface of the semiconductor structure.

A third aspect of the invention provides a system comprising: a computer system including at least one computing device, wherein the computer system is configured to implement a method comprising: designing a semiconductor device, the designing including configuring a shape of a first contact to a semiconductor structure of the device, wherein the configuring includes: defining a parallel profiled shape for at least two contact corners of the first contact in a direction substantially parallel with respect to a surface of the semiconductor structure; and defining a perpendicular profiled shape for at least one edge of the first contact between the at least two contact corners in a direction substantially perpendicular to the surface of the semiconductor structure.

Other aspects of the invention provide methods, systems, program products, and methods of using and generating each, which include and/or implement some or all of the actions described herein. The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 2 shows an illustrative rounded junction electrode structure according to the prior art.

FIG. 3 shows an illustrative electric field distribution between two planar rectangular electrodes according to an embodiment.

FIGS. 4A and 4B show schematic top views of portions of illustrative devices according to an embodiment.

FIG. 5 shows an illustrative electric field distribution between two planar electrodes having corners with a profiled shape according to an embodiment.

FIG. 6 shows a cross-sectional view of an illustrative device according to an embodiment.

FIGS. 7A and 7B show a schematic top view and a cross-sectional view, respectively, of an illustrative field effect transistor according to an embodiment.

FIG. 8 shows an illustrative flow diagram for fabricating a circuit according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
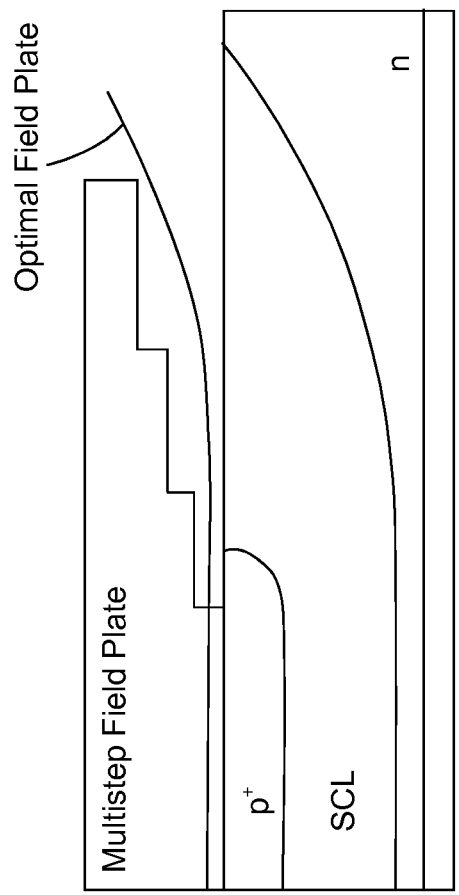
FIG. 1 shows an illustrative configuration for an electrode with multiple field plates according to the prior art.

As indicated above, aspects of the invention provide a profiled contact for a device, such as a high power semiconductor device. The contact is profiled in both a direction substantially parallel to a surface of a semiconductor structure of the device and a direction substantially perpendicular to the surface of the semiconductor structure. The profiling can limit the peak electric field between two electrodes to approximately the same as the average electrical field between the electrodes, as well as limit the electric field perpendicular to the semiconductor structure both within and outside the semiconductor structure. As used herein, unless otherwise noted, the term "set" means one or more (i.e., at least one) and the phrase "any solution" means any now known or later developed solution.

Aspects of the invention provide a solution for designing one or more electrodes for a semiconductor device to reduce the electric field above the semiconductor surface (e.g., in the air or in an encapsulating material) in a direction parallel to the semiconductor surface, while also reducing the electric field in a direction perpendicular to the semiconductor surface both above and below the semiconductor surface, inside the semiconductor. The reductions are achieved by profiling one or more corners of the electrode in a direction substantially parallel to the semiconductor surface and profiling one or more edges of the electrode in a direction substantially perpendicular to the semiconductor surface. The profiling can be performed in a manner so that the peak electric field between two electrodes is nearly the same as the average field between the electrodes. In this manner, premature breakdown between the electrodes is prevented, thereby increasing the operating voltage of the semiconductor device. Furthermore, the corresponding device breakdown voltage increases to close to the breakdown voltage in the bulk of the semiconductor device.

Turning to the drawings, FIG. 3 shows an illustrative electric field distribution 2 between two planar rectangular electrodes 4A, 4B according to an embodiment. Each electrode 4A, 4B comprises a rectangular shape in a direction parallel to a semiconductor structure. As illustrated, the electric field is substantially higher in an area proximate to the respective corners 6A, 6B of the electrodes 4A, 4B. The high electric field can cause breakdown of the corresponding device.

FIGS. 4A and 4B show schematic top views of portions of illustrative devices 10A, 10B according to an embodiment. In FIG. 4A, device 10A is shown including an electrode 12A located on a semiconductor structure 14. Electrode 12A comprises a substantially rectangular shape, with each of the four corners, such as corner 20, being profiled in a direction substantially parallel with respect to a surface of the semiconductor structure 14. In particular, each corner 20 of electrode 12A comprises a rounded shape.

Similarly, in FIG. 4B, device 10B is shown including an electrode 12B located on a semiconductor structure 14. Electrode 12B comprises a substantially rectangular shape, with each of the four corners, such as corner 22, being profiled in a direction substantially parallel with respect to a surface of the semiconductor structure 14. In particular, each corner 22 of electrode 12B comprises a beveled shape.

A desired amount of profiling, such as rounding (e.g., for corner 20) or beveling (e.g., for corner 22), can be determined using any solution. For example, the edge of the electrode 12A, 12B, including the profiled corners 20, 22, respectively, can follow a direction of the field lines that would exist in the vicinity of a rectangular electrode edge. The field lines can be determined using approximate analytical solutions, numerical simulations, and/or the like. While electrodes 12A, 12B are shown with each of the four corners being profiled, it is understood that any number of one or more corners can be profiled. The corner(s) of an electrode 12A, 12B that are profiled can be selected based on a layout of two or more electrodes for a device. For example, corners on the side of an electrode that is adjacent to another electrode can be profiled, while the opposing corners may not be profiled.

The configuration of each electrode 12A, 12B can reduce the peak electrical fields at the corners 20, 22 of each electrode 12A, 12B. For example, FIG. 5 shows an illustrative electric field distribution 30 between two planar electrodes 32A, 32B having corners with a profiled shape in a direction substantially parallel with respect to a surface of a semiconductor structure according to an embodiment. As illustrated, the profiled configuration of electrodes 32A, 32B reduces the peak electric field in areas proximate to the respective corners 34A, 34B in comparison to the electric field distribution 2 for rectangular electrodes 4A, 4B shown in FIG. 3. In particular, the electric field 30 is substantially uniform across the entire electrodes 32A, 32B, with only a slightly higher electric field in the areas proximate to the respective corners 34A, 34B of the electrodes 32A, 32B. While electrodes 32A, 32B are shown having rounded corners, it is understood that a similar electric field distribution 30 will be obtained for electrodes having beveled corners.

Electrode edges also can lead to a rise in the electric field in a direction perpendicular to the surface of the semiconductor structure. In general, field-plating techniques can address this problem by reducing the peak electric field in the semiconductor structure. However, above the surface of the semiconductor structure, non-uniform field distribution similar to the field distribution 2 of FIG. 3 can still be present.

To this extent, aspects of the invention further provide for one or more edges of the electrode to be profiled in a direction substantially perpendicular to the surface of the semiconductor structure. To this extent, FIG. 6 shows a cross-sectional view of an illustrative device according to an embodiment. As illustrated, device 40 includes a pair of electrodes 42A, 42B each of which comprises an edge 44A, 44B, respectively profiled in a direction substantially perpendicular to the surface of a semiconductor structure 14 on which electrodes 42A, 42B are located. Each edge 44A, 44B is formed by a plurality of steps. For electrodes 42A, 42B, the steps at the topmost and bottommost (with respect to the surface of the semiconductor structure 14) of the electrodes 42A, 42B are shorter than the steps in the perpendicularly central portion of the electrodes 42A, 42B. In this case, the profile of the bottom portion of the electrodes 42A, 42B is designed to reduce a peak electric field below the surface of the semiconductor structure 14, while the profile of the top portion of the electrodes 42A, 42B is designed to reduce the vertical component of the electric field above the semiconductor surface. However, it is understood that any number of steps and/or alternative profiled shape can be implemented according to alternative embodiments.

Furthermore, each electrode 42A, 42B is shown having a single profiled edge 44A, 44B. In an embodiment, the profiled edge 44A, 44B comprises an edge adjacent to another electrode 42A, 42B. However, it is understood that two or more edges can be profiled. To this extent, the profile of each edge can be substantially similar to the profiles of profiled edges 44A, 44B or the profile of one or more edges can differ.

In an embodiment, each step is formed by a field termination extension electrode. The additional field termination electrodes serve to smoothen the electric field distribution in the direction perpendicular to the surface of the semiconductor 14, thereby increasing the breakdown voltage in the spacing between the electrodes 42A, 42B. A shape of the profiled edge 44A, 44B can be determined using any solution, e.g., by approximating a direction of the field lines that would exist in the vicinity of a substantially vertical electrode edge. The field lines can be determined using approximate analytical solutions, numerical simulations, and/or the like.

The electrodes shown and described herein can be utilized in various types of devices. For example, illustrative devices include high voltage planar devices, such as field effect transistors, bipolar transistors, diodes (e.g., Schottky or junction), high voltage switches, amplifiers, oscillators, converters, and/or the like. Additionally, it is understood that one or more additional solutions for increasing the breakdown voltage can be performed in designing and/or fabricating the device. For example, an encapsulation layer comprising any type of insulating material can be applied over the electrodes shown and described herein.

FIGS. 7A and 7B show a schematic top view and a cross-sectional view, respectively, of an illustrative field effect transistor 50 according to an embodiment. As shown in FIG. 7A, a source contact 52A, a drain contact 52B, and a gate contact 54 of the field effect transistor 50 each comprises corners having a parallel profile (e.g., rounded) to reduce a peak electric field in the regions near the corners. While rounded profiles are shown for illustrative purposes, it is understood that beveled corners can be implemented. Additionally, as shown in FIG. 7B, the source contact 52A and the drain contact 52B are each shown having an edge having a perpendicular profile to reduce a peak electric field both below and above the surface (e.g., within air, encapsulating material, or the like) of the semiconductor structure 14.

The various contacts shown and described herein can comprise any type of contact and be formed using any type of contact material. For example, a contact described herein can comprise an ohmic contact, a rectifying contact, or the like. Additionally, the contacts described herein can be formed of any type of material, such as a metal (e.g., gold), a multi-layered metal-semiconductor structure, and/or the like. The content and formation of the contact can be selected based on one or more functional attributes and one or more attributes of the semiconductor structure 14 using any solution.

The various devices shown and described herein can be formed using any type of semiconductor structure 14, which comprises any combination of one or more layers of material capable of forming a device channel. In an embodiment, the semiconductor structure 14 comprises a silicon-based semiconductor structure 14, such as silicon, silicon carbide, or the like. In another embodiment, the semiconductor structure 14 comprises a heterostructure, in which a device channel (e.g., a two-dimensional device channel) is formed at an interface of two structures. The semiconductor structure 14 can include any number of one or more layers of materials selected from any now known or later developed material system, which will form such a device channel. For example, the semiconductor structure 14 can comprise one or more layers of materials selected from the group-III nitride material system (e.g., $Al_XIn_YGa_{1-X-Y}N$, where $0 \leq X, Y \leq 1$, and $X+Y \leq 1$ and/or alloys thereof) deposited on any type of substrate (e.g., sapphire). Similarly, the semiconductor structure 14 can comprise one or more layers of materials selected from the group-III arsenide material system (e.g., $Al_xGa_{1-x}As$, where $0 \le X \le 1$ and/or alloys thereof). In a particular embodiment, the semiconductor structure 14 comprises an AlGaN/GaN compound semiconductor.

While shown and described herein as a method of designing and/or fabricating a semiconductor device, it is understood that aspects of the invention further provide various alternative embodiments. For example, in one embodiment, the invention provides a method of designing and/or fabricating a circuit that includes one or more of the semiconductor devices designed and fabricated as described herein.

To this extent, FIG. 8 shows an illustrative flow diagram for fabricating a circuit 126 according to an embodiment. Initially, a user can utilize a device design system 110 to generate a device design 112 using a method described herein. The device design 112 can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122. The circuit design 122 can include a device designed using a method described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed using a method described herein.

In another embodiment, the invention provides a device design system 110 for designing and/or a device fabrication system 114 for fabricating a semiconductor device 116 by applying the method described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated using a method described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
a semiconductor structure; and
a first contact located on a surface of the semiconductor structure, wherein the first contact comprises at least two contact corners having a substantially lateral direction with respect to a surface of the semiconductor structure and a substantially perpendicular direction with respect to the surface of the semiconductor structure, wherein the at least two contact corners have a lateral profiled shape along the substantially lateral direction and at least one edge having a perpendicular profiled shape along the substantially perpendicular direction, wherein the lateral profiled shape of each of the at least two contact corners provides a gradual transition between a first edge and a second edge forming the corresponding contact corner and the perpendicular profiled shape provides a non-planar transition from the surface of the semiconductor structure to a top surface of the first contact.

2. The device of claim 1, wherein the lateral profiled shape is configured to provide an electric field at each of the at least two contact corners less than a critical electric field corresponding to a maximum operating voltage of the device.

3. The device of claim 1, wherein the perpendicular profiled shape is configured to provide an electric field at the at least one edge less than a critical electric field corresponding to a maximum operating voltage of the device.

4. The device of claim 1, wherein the lateral profiled shape comprises one of a rounded or a beveled shape.

5. The device of claim 1, wherein the perpendicular profiled shape includes a plurality of steps.

6. The device of claim 5, wherein the plurality of steps includes:
a first set of steps configured to reduce a peak electric field below the surface of the semiconductor structure; and
a second set of steps configured to reduce a peak electric field above the surface of the semiconductor structure.

7. The device of claim 1, further comprising a second contact located on the semiconductor structure adjacent to the first contact, wherein the second contact comprises at least two contact corners having a lateral profiled shape in a direction substantially parallel with respect to a surface of the semiconductor structure and at least one edge between the at least two contact corners comprising a perpendicular profiled shape in a direction substantially perpendicular to the surface of the semiconductor structure.

8. The device of claim 7, wherein the at least one edge of the first contact and the at least one edge of the second contact comprise facing sides of the first contact and the second contact.

9. The device of claim 1, wherein the semiconductor structure comprises one of: a silicon-based semiconductor structure, a group-Ill nitride-based heterostructure, or a group-Ill arsenic-based heterostructure.

10. The device of claim 1, wherein the device is configured to operate as one of: a field effect transistor, a Schottky diode, a junction diode, or a bipolar transistor.

11. A method comprising:
designing a semiconductor device using a computer system including at least one computing device, the designing including configuring a shape of a first contact located on a surface of a semiconductor structure of the device using the computer system, wherein the first contact comprises at least two contact corners having a substantially lateral direction with respect to a surface of the semiconductor structure and a substantially perpendicular direction with respect to the surface of the semiconductor structure, and wherein the configuring includes:
defining a lateral profiled shape for the at least two contact corners of the first contact along the substantially lateral direction, wherein the lateral profiled shape of each of the at least two contact corners provides a gradual transition between a first edge and a second edge forming the corresponding contact corner; and
defining a perpendicular profiled shape for the at least one edge of the first contact, wherein the perpendicular profiled shape provides a non-planar transition from the surface of the semiconductor structure to a top surface of the first contact.

12. The method of claim 11, wherein the lateral profiled shape comprises one of a rounded or a beveled shape.

13. The method of claim 11, wherein the perpendicular profiled shape includes a plurality of steps, the plurality of steps including:
a first set of steps configured to reduce a peak electric field below the surface of the semiconductor structure; and
a second set of steps configured to reduce a peak electric field above the surface of the semiconductor structure.

14. The method of claim 11, the designing further including configuring a shape of a second contact to the semiconductor structure of the device located on the semiconductor structure adjacent to the first contact, wherein the second contact comprises at least two contact corners having a lateral profiled shape in a direction substantially parallel with respect to a surface of the semiconductor structure and at least one edge between the at least two contact corners comprising a perpendicular profiled shape in a direction substantially perpendicular to the surface of the semiconductor structure, and wherein the at least one edge of the first contact and the at least one edge of the second contact comprise facing sides of the first contact and the second contact.

15. The method of claim 11, further comprising fabricating the semiconductor device, wherein the fabricating includes forming the first contact on the surface of the semiconductor structure.

16. The method of claim 15, wherein the forming includes profiling the at least two contact corners and the at least one edge of the first contact in substantially parallel and substantially perpendicular directions with respect to the surface of the semiconductor structure.

17. A system comprising:
a computer system including at least one computing device, wherein the computer system is configured to implement a method comprising:
designing a semiconductor device, the designing including configuring a shape of a first contact located on a surface of a semiconductor structure of the device, wherein the first contact comprises at least two contact corners having a substantially lateral direction with respect to a surface of the semiconductor structure and a substantially perpendicular direction with respect to the surface of the semiconductor structure, and wherein the configuring includes:
defining a lateral profiled shape for the at least two contact corners of the first contact along the substantially lateral direction, wherein the lateral profiled shape of each of the at least two contact corners provides a gradual transition between a first edge and a second edge forming the corresponding contact corner; and
defining a perpendicular profiled shape for the at least one edge of the first contact, wherein the perpendicular profiled shape provides a non-planar transition from the surface of the semiconductor structure to a top surface of the first contact.

18. The system of claim 17, further comprising a device fabrication system configured to fabricate the semiconductor device, wherein the fabricating includes:
forming the semiconductor structure; and
forming the first contact on the surface of the semiconductor structure.

19. The system of claim 18, wherein the forming the first contact includes profiling the at least two contact corners and the at least one edge of the first contact in substantially parallel and substantially perpendicular directions with respect to the surface of the semiconductor structure.

20. The system of claim 18, further comprising a circuit fabrication system configured to configured to fabricate a circuit including the semiconductor device.

* * * * *